(12) United States Patent
Kim et al.

(10) Patent No.: US 8,259,245 B2
(45) Date of Patent: *Sep. 4, 2012

(54) LIQUID CRYSTAL DISPLAY AND PHOTOMASK FOR MANUFACTURING THE SAME

(75) Inventors: Yoon-Jang Kim, Suwon-si (KR); Young-Goo Song, Cheonan-si (KR); Sung-Jae Moon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 531 days.

This patent is subject to a terminal disclaimer.

(21) Appl. No.: 12/472,148

(22) Filed: May 26, 2009

(65) Prior Publication Data
US 2010/0123843 A1 May 20, 2010

(30) Foreign Application Priority Data
Nov. 17, 2008 (KR) .................. 10-2008-0114093

(51) Int. Cl.
*G02F 1/1343* (2006.01)

(52) U.S. Cl. ............... 349/39; 349/19; 349/33; 349/38; 349/41; 349/42

(58) Field of Classification Search .............. 349/19, 349/33, 38, 39, 41, 42, 43
See application file for complete search history.

(56) References Cited

U.S. PATENT DOCUMENTS

| 7,973,864 | B2 * | 7/2011 | Kim ............................... 349/38 |
| 2007/0058123 | A1 * | 3/2007 | Um et al. ....................... 349/144 |
| 2010/0066658 | A1 * | 3/2010 | Kim et al. ....................... 345/98 |

FOREIGN PATENT DOCUMENTS

| KR | 1020050001742 | 1/2005 |
| KR | 1020050060730 | 6/2005 |
| KR | 1020060074945 | 7/2006 |
| KR | 1020070045750 | 5/2007 |
| KR | 1020070084770 | 8/2007 |
| KR | 1020080004809 | 1/2008 |

* cited by examiner

*Primary Examiner* — Jennifer Doan
(74) *Attorney, Agent, or Firm* — H.C. Park & Associates, PLC

(57) ABSTRACT

Disclosed are a liquid crystal display and a photomask for manufacturing the liquid crystal display. The liquid crystal display includes a substrate, a pixel electrode disposed on the substrate and including first and second sub-pixel electrodes, a first thin film transistor having first gate and source electrodes and a first drain electrode connected to the first sub-pixel electrode, a second thin film transistor having second gate and source electrodes and a second drain electrode connected to the second sub-pixel electrode, and a third thin film transistor having third gate and drain electrodes and a third source electrode connected to the second sub-pixel electrode. A first gate signal is applied to the first and second gate electrodes, a second gate signal is applied to the third gate electrode, the same data signal is applied to the first and second source electrodes, and the second drain electrode and the third source electrode are connected to each other.

14 Claims, 18 Drawing Sheets

LIQUID CRYSTAL DISPLAY AND PHOTOMASK FOR MANUFACTURING THE SAME

CROSS-REFERENCE TO RELATED APPLICATION

This application claims priority to and the benefit of Korean Patent Application No. 10-2008-0114093, filed on Nov. 17, 2008, which is hereby incorporated by reference for all purposes as if fully set forth herein.

BACKGROUND OF THE INVENTION

1. Field of the Invention

The present invention relates to a liquid crystal display, and a photomask for manufacturing the same.

2. Discussion of the Related Art

Liquid crystal displays are a widely used flat panel display. A liquid crystal display has two display panels on which field generating electrodes, such as pixel electrodes and a common electrode, are formed, and a liquid crystal layer is interposed between the panels. In the liquid crystal display, voltages are applied to the field generating electrodes to generate an electric field over the liquid crystal layer, thereby determining the alignment of liquid crystal molecules of the liquid crystal layer. Accordingly, the polarization of incident light may be controlled, thereby performing image display.

The liquid crystal display further includes switching elements respectively connected to the pixel electrodes, and a plurality of signal lines, including gate and data lines for controlling the switching elements, to thereby apply voltages to the pixel electrodes.

Among the liquid crystal displays, a vertical alignment (VA) mode liquid crystal display, in which directors of liquid crystal molecules stand vertical to the upper and lower display panels when an electric field is not applied thereto, is highlighted in that it involves a high contrast ratio and a wide reference viewing angle. The reference viewing angle means a viewing angle with a contrast ratio of 1:10, or an inter-gray luminance inversion limitation angle.

With the VA mode liquid crystal display, a pixel may be bisected into two sub-pixels and different voltages are applied to the two sub-pixels, differentiating them in light transmittance, thereby making lateral visibility approximate to frontal visibility.

In order to differentiate the light transmittance, the same voltage may be applied to the two sub-pixels, and the voltage applied to either one of the two sub-pixels may be lowered using a separate switching element. However, in this case, the liquid crystal display may have many signal lines and contact holes, thereby deteriorating the aperture ratio.

Further, the liquid crystal display includes polarizers to intercept or pass light that is incident thereto. If the edge portion of the pixel electrode does not agree in direction to the polarization axis of the polarizers, leakage of light may occur at that edge of the pixel electrode.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a liquid crystal display that may secure a proper aperture ratio while differentiating voltages of two sub-pixels, and prevent leakage of light even when polarization axes of the polarizers do not agree in direction to the edge of the pixel electrode.

Additional features of the invention will be set forth in the description which follows, and in part will be apparent from the description, or may be learned by practice of the invention.

The present invention discloses a liquid crystal display including a substrate, a pixel electrode disposed on the substrate and having first and second sub-pixel electrodes, and first, second, and third thin film transistors. The first thin film transistor has first gate and source electrodes, and a first drain electrode connected to the first sub-pixel electrode. The second thin film transistor has second gate and source electrodes, and a second drain electrode connected to the second sub-pixel electrode. The third thin film transistor has third gate and drain electrodes, and a third source electrode connected to the second sub-pixel electrode. A first gate signal is applied to the first and second gate electrodes, a second gate signal is applied to the third gate electrode, the same data signal is applied to the first and second source electrodes, and the second drain electrode and the third source electrode are connected to each other.

The present invention also discloses a liquid crystal display including a first gate line to transmit a first gate signal, a second gate line to transmit a second gate signal, a data line to transmit a data voltage, a first sub-pixel connected to the first gate line and the data line, and a second sub-pixel connected to the first and second gate lines and the data line. The first sub-pixel includes a first switching element connected to the first gate line and the data line, and a first liquid crystal capacitor and a first storage capacitor connected to the first switching element. The second sub-pixel includes a second switching element connected to the first gate line and the data line, a second liquid crystal capacitor and a second storage capacitor connected to the second switching element, a third switching element connected to the second gate line and the second liquid crystal capacitor, a step-down capacitor connected to the third switching element, and a step-up capacitor connected to the third switching element and the second liquid crystal capacitor.

The present invention also discloses a liquid crystal display including a pixel electrode and a light interception member. The pixel electrode has a pair of vertical edges facing each other, and first and second oblique edges that neighbor the vertical edges and meet each other at a right angle. The light interception member neighbors the first and second oblique edges. The light interception member has a plurality of steps. Each step has horizontal and vertical portions, and the horizontal and vertical portions of the steps have a length of 8 to 12 μm, respectively.

The present invention also discloses a photomask including a substrate and a photo-barrier film formed on the substrate. The photo-barrier film has a plurality of steps. Each step has a first edge and a second edge neighboring the first edge.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
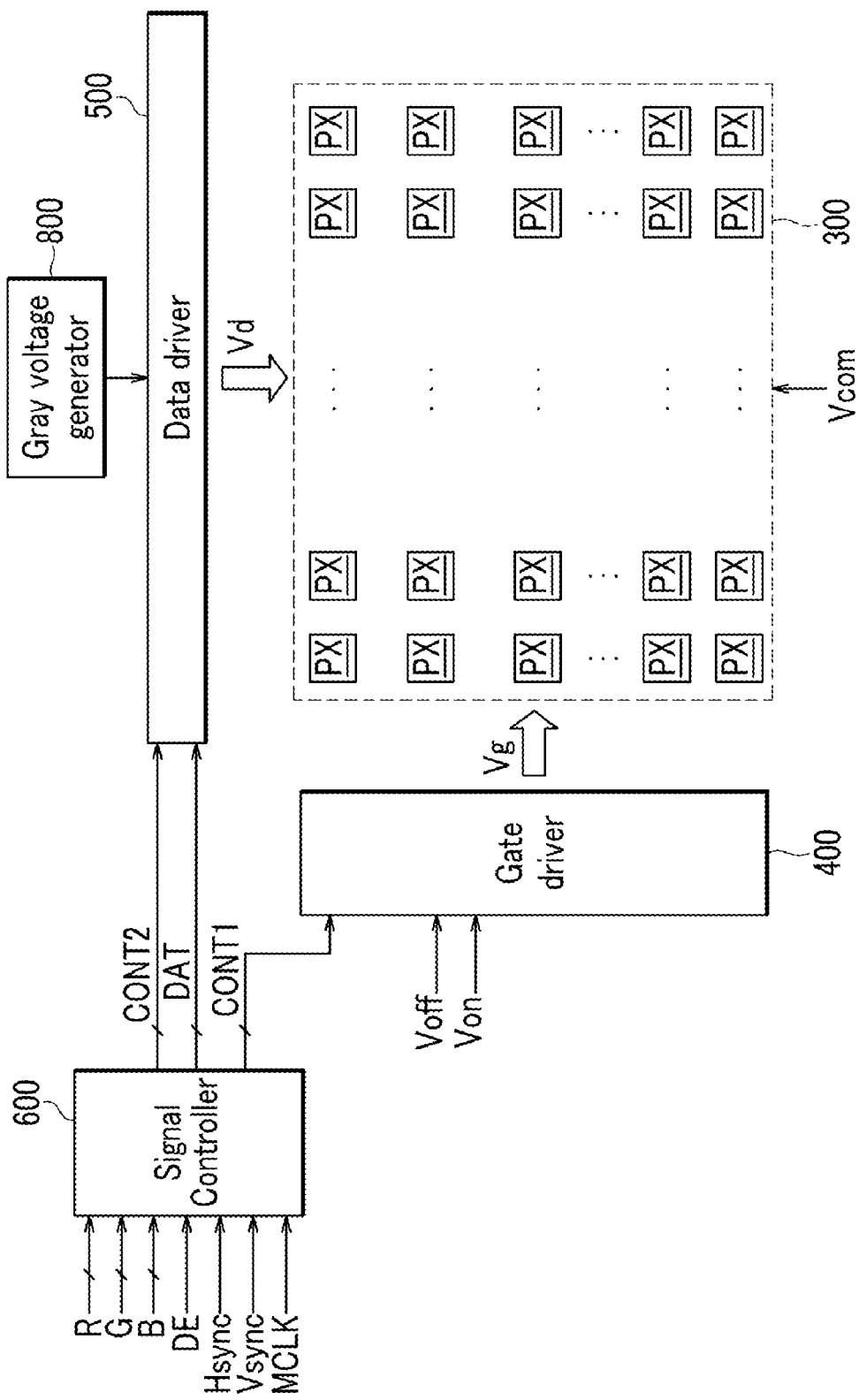
FIG. 1 is a block diagram of a liquid crystal display according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element, it can be directly on or directly connected to the other element or intervening elements may also be present. In contrast, when an element is referred to as being "directly on" or "directly connected to" another element, there are no intervening elements present.

A liquid crystal display according to an exemplary embodiment of the present invention will be now described in detail with reference to FIG. 1, FIG. 2, and FIG. 3.

Figure 2:
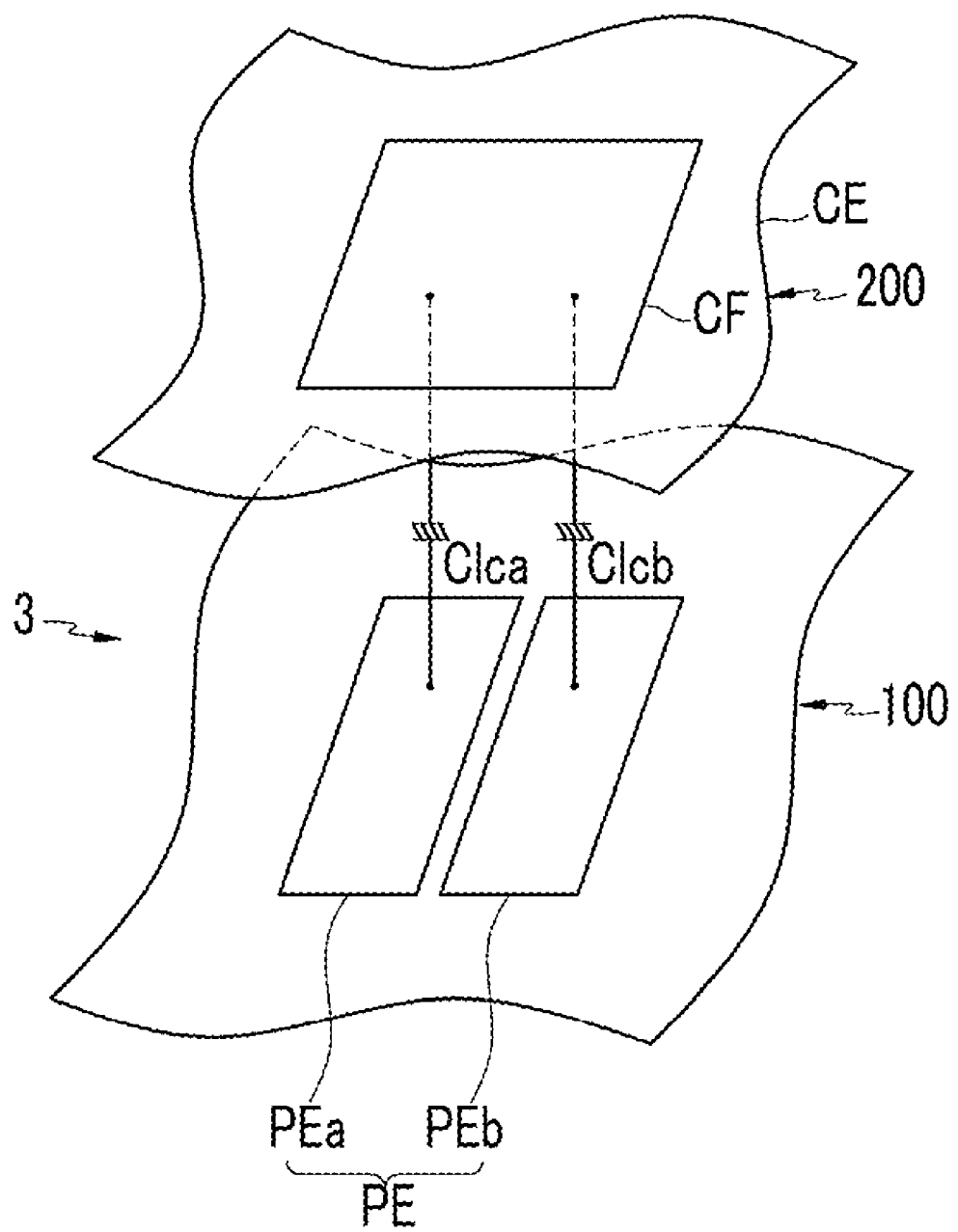
FIG. 2 shows a structure of a liquid crystal display according to an exemplary embodiment of the present invention, together with an equivalent circuit of two sub-pixels thereof.
Figure 3:
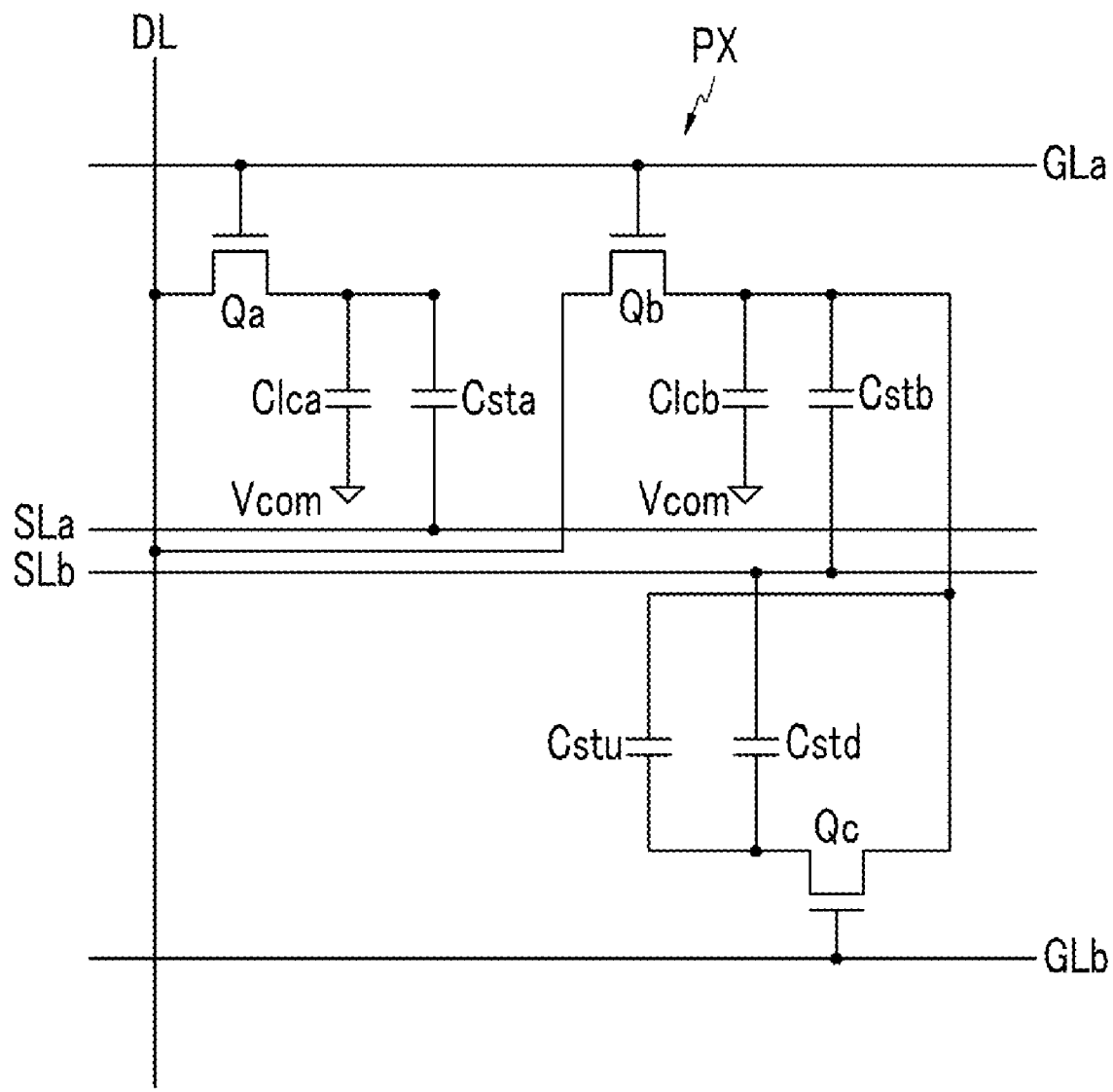
FIG. 3 is an equivalent circuit diagram of a pixel of a liquid crystal display according to an exemplary embodiment of the present invention.

FIG. 1 is a block diagram of a liquid crystal display according to an exemplary embodiment of the present invention, FIG. 2 shows a structure of a liquid crystal display according to an exemplary embodiment of the present invention together with an equivalent circuit of two sub-pixels thereof, and FIG. 3 is an equivalent circuit diagram of a pixel of a liquid crystal display according to an exemplary embodiment of the present invention.

As shown in FIG. 1, a liquid crystal display according to an exemplary embodiment of the present invention includes a liquid crystal panel assembly 300, a gate driver 400, a data driver 500, a gray voltage generator 800, and a signal controller 600.

As the equivalent circuit of FIG. 3 shows, the liquid crystal panel assembly 300 includes a plurality of signal lines GLa, GLb, DL, SLa, and SLb, and a plurality of pixels PX connected to those signal lines and arranged in the form of a matrix. Further, as FIG. 2 shows, the liquid crystal panel assembly 300 includes lower and upper panels 100 and 200, and a liquid crystal layer 3 interposed therebetween.

Referring to FIG. 3, the signal lines include a plurality of gate lines GLa and GLb for transmitting gate signals (also called "scanning signals"), a plurality of data lines DL for transmitting data voltages Vd, and a plurality of storage electrode lines SLa and SLb. The gate lines GLa and GLb and the storage electrode lines SLa and SLb proceed in a row direction while being substantially parallel to each other, and the data lines DL proceed in a column direction while being substantially parallel to each other.

Each pixel PX includes a pair of sub-pixels, which in turn include liquid crystal capacitors Clca and Clcb. The two sub-pixels include switching elements Qa, Qb, and Qc connected to the gate lines GLa and GLb, the data lines DL, and the liquid crystal capacitors Clca and Clcb.

The liquid crystal capacitors Clca and Clcb have sub-pixel electrodes PEa and PEb of the lower display panel 100 and a common electrode CE of the upper display panel 200 as two terminals, and the liquid crystal layer 3 interposed between the sub-pixel electrodes PEa and PEb and the common electrode CE as a dielectric. The pair of sub-pixel electrodes PEa and PEb are spaced apart from each other, and together they form a pixel electrode PE. The common electrode CE is formed on the entire surface of the upper panel 200, and it receives a common voltage Vcom. The liquid crystal layer 3 may have negative dielectric anisotropy, and liquid crystal molecules of the liquid crystal layer 3 may be aligned such that the directors thereof stand vertical to the surface of the two display panels when no electric field is applied thereto. Differing from the case of FIG. 2, the common electrode CE may be formed on the lower display panel 100. In this case, at least one of the pixel electrode PE and the common electrode CE may be formed in the shape of a line or bar.

To display color images, the respective pixels PX may uniquely display one of the primary colors (spatial division), or the respective pixels PX may alternately display the primary colors in a temporal order (temporal division) so as to allow the desired colors to be recognized by spatial or temporal sums of the primary colors. The primary colors may be three colors of red, green, and blue. FIG. 2 shows spatial division where a color filter CF for displaying one of the primary colors is provided on the upper display panel 200 per each pixel PX. Alternatively, the color filter CF may be placed on the lower display panel 100 over or below the sub-pixel electrodes PEa and PEb.

Polarizers (not shown) are provided on the outer surfaces of the display panels 100 and 200 such that the polarization axes thereof may be perpendicular to each other. With the case of a reflective liquid crystal display, one of the two polarizers may be omitted. When the polarizers are crossed polarizers, light incident upon the liquid crystal layer 3 is interrupted when no electric field is applied thereto.

Referring to FIG. 1 again, the gray voltage generator 800 generates all or a limited number of gray voltages ("reference gray voltages") related to the transmittance of the pixels PX. The reference gray voltages may include positive polarity and negative polarity gray voltages with respect to the common voltage Vcom.

The gate driver 400 is connected to the gate lines GLa and GLb of the liquid crystal panel assembly 300, and applies gate signals Vg with combinations of a gate-on voltage Von and a gate-off voltage Voff to the gate lines GLa and GLb.

The data driver 500 is connected to the data lines DL of the liquid crystal panel assembly 300, and it selects gray voltages from the gray voltage generator 800 to apply them to the data lines DL as data voltages Vd. However, the gray voltage generator 800 may only provide a limited number of reference gray voltages. In this case, the data driver 500 divides the reference gray voltages to thereby generate the desired data voltages.

The signal controller 600 controls the gate driver 400, the data driver 500, etc.

The respective drivers 400, 500, 600, and 800 may be directly mounted on the liquid crystal panel assembly 300 in the form of at least one integrated circuit (IC) chip, or they may be attached to the liquid crystal panel assembly 300 in the form of a tape carrier package (TCP) while being mounted on a flexible printed circuit film (not shown). The drivers 400, 500, 600, and 800 may be mounted on a separate printed circuit board (PCB, not shown). Alternatively, the drivers 400, 500, 600, and 800 may be integrated on the liquid crystal panel assembly 300 together with the signal lines GLa, GLb, and DL and the thin film transistor switching element Qa, Qb, and Qc. Furthermore, the drivers 400, 500, 600, and 800 may be integrated in a single chip, and in this case, at least one of the drivers or at least one circuit element thereof may be placed external to the single chip.

A liquid crystal panel assembly according to an exemplary embodiment of the present invention will now be described in detail with reference to FIG. 3, FIG. 4, FIG. 5, FIG. 6, and FIG. 7.

FIG. 3 is an equivalent circuit diagram of a pixel of a liquid crystal panel assembly according to an exemplary embodiment of the present invention.

Referring to FIG. 3, a liquid crystal display according to an exemplary embodiment of the present invention includes signal lines with first and second gate lines GLa and GLb neighboring each other, a data line DL, first and second storage electrode lines SLa and SLb, and a pixel PX connected to the signal lines.

The pixel PX includes first, second, and third switching elements Qa, Qb, and Qc, first and second liquid crystal capacitors Clca and Clcb, first and second storage capacitors Csta and Cstb, a step-down capacitor Cstd, and a step-up capacitor Cstu.

The first and second switching elements Qa and Qb are both connected to the first gate line GLa and the data line DL, and the third switching element Qc is connected to the second gate line GLb.

The first and second switching elements Qa and Qb have three terminal elements of thin film transistors provided on the lower display panel 100. The control terminals of the first and second switching elements Qa and Qb are connected to the first gate line GLa, the input terminals are connected to the data line DL, and the output terminals are respectively connected to the first and second liquid crystal capacitors Clca and Clcb and the first and second storage capacitors Csta and Cstb.

The third switching element Qc is also a three terminal element of a thin film transistor provided on the lower display panel 100. The control terminal of the third switching element Qc is connected to the second gate line GLb, the input terminal is connected to the second liquid crystal capacitor Clcb, and the output terminal is connected to the step-down capacitor Cstd and the step-up capacitor Cstu.

The first and second storage capacitors Csta and Cstb are respectively connected to the first and second switching elements Qa and Qb and the first and second storage electrode lines SLa and SLb, and they serve to assist the first and second liquid crystal capacitors Clca and Clcb. The first and second storage capacitors Csta and Cstb are formed by overlapping the storage electrode lines SLa and SLb and the pixel electrode PE provided on the lower panel 100 with each other and interposing an insulator, and a predetermined voltage such as the common voltage Vcom may be applied to the storage electrode lines SLa and SLb.

The step-down capacitor Cstd is connected to the output terminal of the third switching element Qc and the second storage electrode line SLb, and is formed by overlapping the second storage electrode line SLb and the output electrode of the third switching element Qc provided on the lower display panel 100 with each other and interposing an insulator.

The step-up capacitor Cstu is connected to the output terminal of the third switching element Qc and the second liquid crystal capacitor Clcb, and is formed by overlapping the second sub-pixel electrode PEb and the output electrode of the third switching element Qc provided on the lower display panel 100 with each other and interposing an insulator. The step-up capacitor Cstu is lower in capacitance than the step-down capacitor Cstd.

The liquid crystal panel assembly shown in FIG. 3 will now be described in detail with reference to FIG. 4, FIG. 5, FIG. 6, and FIG. 7.

Figure 4:
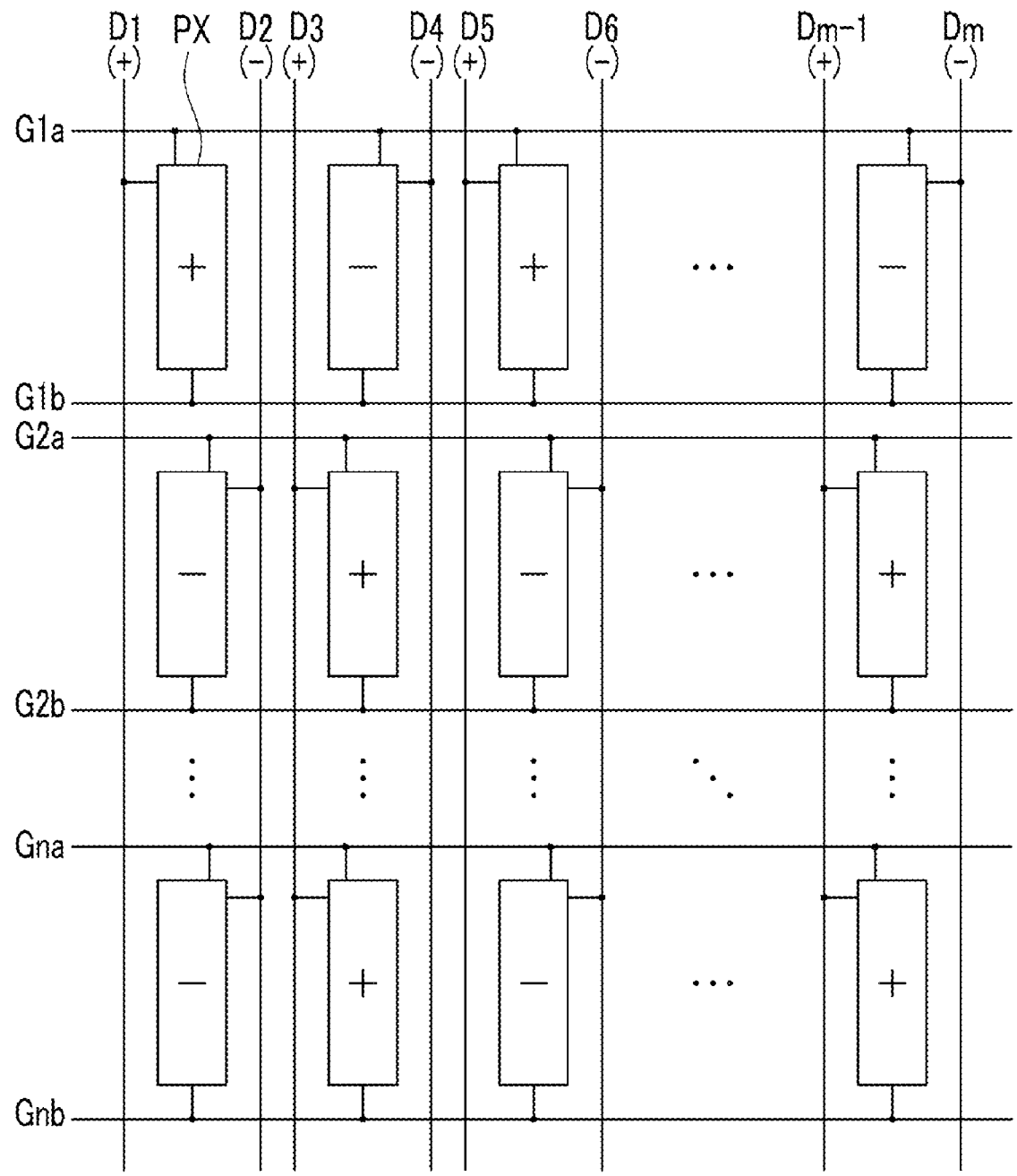
FIG. 4 shows an arrangement of signal lines and pixels of a liquid crystal display according to an exemplary embodiment of the present invention.

FIG. 4 shows the arrangement of signal lines and pixels in a liquid crystal display according to an exemplary embodiment of the present invention.

Referring to FIG. 4, a liquid crystal panel assembly 300 according to an exemplary embodiment of the present invention includes a plurality of pixels PX arranged in the form of a matrix. A plurality of first and second gate lines G1a and G1b, G2a and G2b, . . . , and Gna and Gnb are arranged by pair per each pixel row. A plurality of data lines D1 and D2, D3 and D4, D5 and D6, . . . , and Dm-1 and Dm are arranged by pairs per each pixel column.

The pixels PX neighboring each other in the row direction are connected to different pairs of the left and right data lines D1 and D2, D3 and D4, D5 and D6, . . . , and Dm-1 and Dm. Furthermore, the pixel neighbors PX in the column direction are connected to the same pair of the left and right data lines D1 and D2, D3 and D4, D5 and D6, . . . , and Dm-1 and Dm. That is, the plurality of pixels PX disposed at the same row are alternately connected to either the right-sided or the left-sided data lines D1 to Dm of different pairs of data lines D1 to Dm, and the plurality of pixels PX disposed at the same column are alternately connected to either the right-sided or the left-sided data lines D1 to Dm of the same pair of data lines D1 to Dm.

The respective two first gate line neighbors G1a and G2a, . . . , and G(n-1)a and Gna may be connected to each other so as to receive the same gate signal.

The data voltages flowing along the left-sided and the right-sided data lines D1 and D2, D3 and D4, D5 and D6, . . . , Dm-1 and Dm, based on each pixel PX, are opposite in 20 polarity to each other. That is, the data voltages flowing along the data lines D1, D3, D5, . . . , Dm-1 left of the respective pixels PX are positive (+) in polarity, while the data voltages flown along the data lines D2, D4, D6 . . . , and Dm right of the respective pixels PX are negative (−) in polarity. These polarities may be inverted, for example, each frame.

Accordingly, the pixels PX neighboring each other in the row direction are opposite in polarity to each other, and the pixels PX neighboring to each other in the column direction are also opposite in polarity to each other.

A liquid crystal panel assembly according to an exemplary embodiment of the present invention will now be described in detail with reference to FIG. 5, FIG. 6, and FIG. 7.

Figure 5:
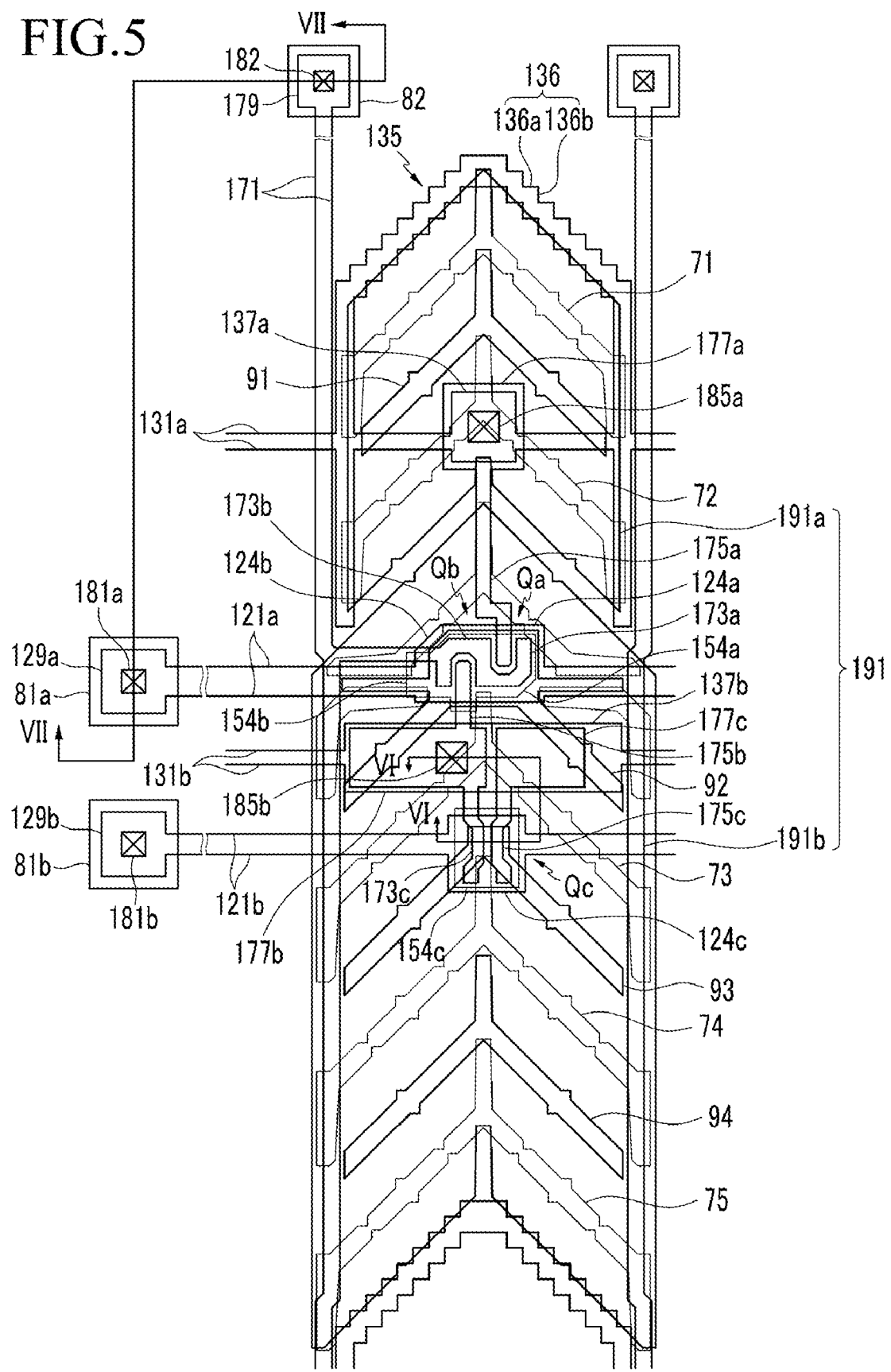
FIG. 5 is a layout view of a liquid crystal panel assembly according to an exemplary embodiment of the present invention.
Figure 6:
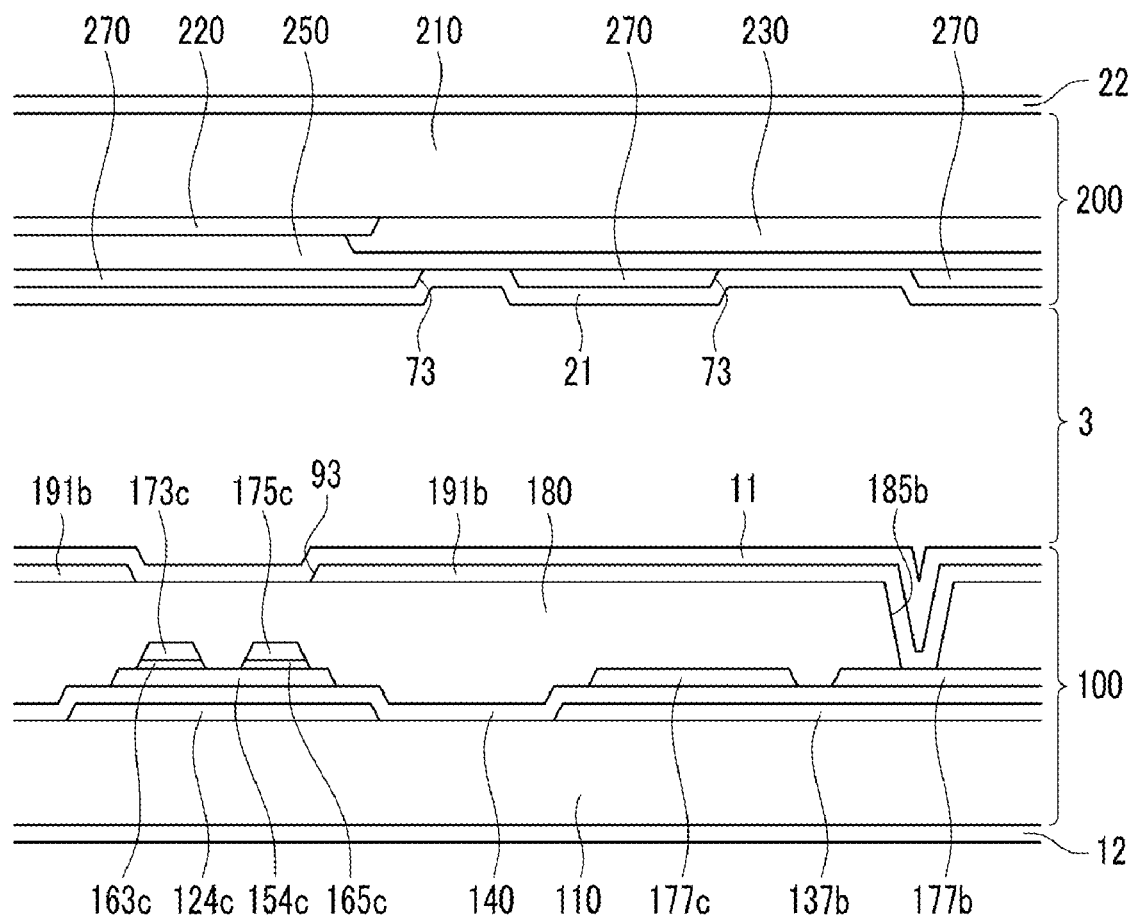
FIG. 6 and FIG. 7 are cross-sectional views taken along lines VI-VI and VII-VII of FIG. 5, respectively.
Figure 7:
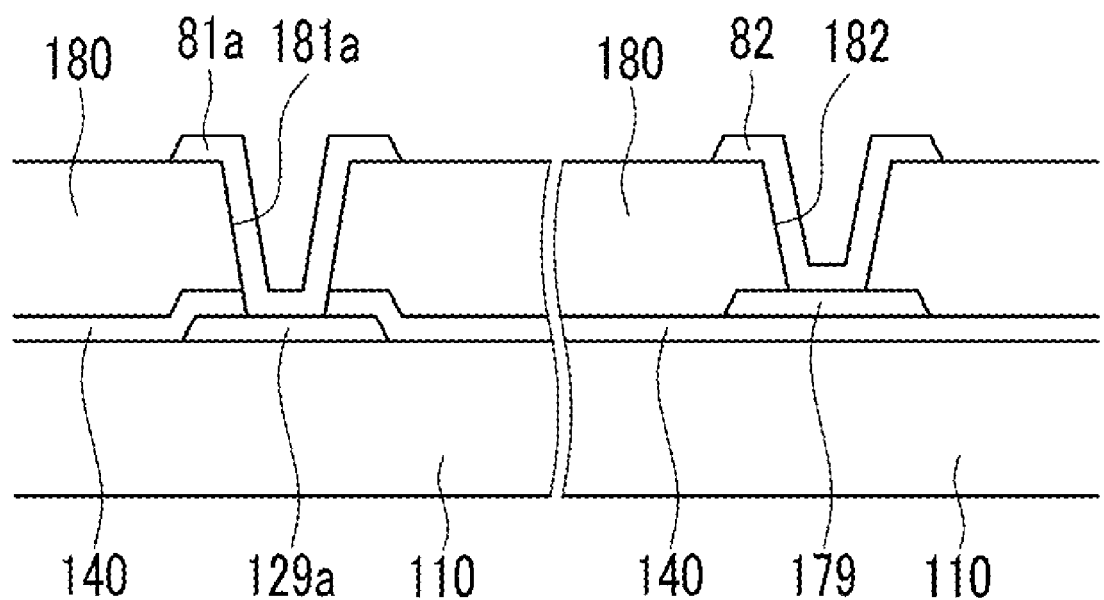

FIG. 5 is a layout view of a liquid crystal panel assembly according to an exemplary embodiment of the present invention, and FIG. 6 and FIG. 7 are cross-sectional views taken along lines VI-VI and VII-VII of FIG. 5, respectively.

The liquid crystal display according to the present exemplary embodiment includes lower and upper display panels 100 and 200, a liquid crystal layer 3 interposed between the two display panels 100 and 200, and a pair of polarizers 12 and 22 attached to the outer surfaces of the display panels 100 and 200, respectively.

The lower display panel 100 will be described first.

A plurality of gate conductors including a plurality of pairs of first and second gate lines 121a and 121b and a plurality of pairs of first and second storage electrode lines 131a and 131b are formed on an insulation substrate 110. The first gate line 121a has first and second gate electrodes 124a and 124b and an end portion 129a, and the second gate line 121b has a third gate electrode 124c and an end portion 129b.

The first storage electrode line 131a has a first storage electrode 137a protruded up and downward, and a stem line portion extended vertical to the gate lines 121a and 121b. Furthermore, the first storage electrode line 131a has a light interception member 135 extended from the stem line portion and obliquely angled to the gate lines 121a and 121b.

The second storage electrode line 131b has a second storage electrode 137b protruded up and downward.

A gate insulating layer 140 is formed on the gate conductors 121a, 121b, 131a, and 131b. First, second, and third semiconductor islands 154a, 154b, and 154c are formed on the gate insulating layer 140, and are overlaid with a plurality of first ohmic contacts (not shown), second ohmic contacts (not shown), and third ohmic contacts 163c and 165c.

Data conductors including a plurality of data lines 171 and a plurality of first, second, and third drain electrodes 175a, 175b, and 175c are formed on the ohmic contacts and the gate insulating layer 140.

Each data line 171 has a plurality of first and second source electrodes 173a and 173b, and a wide end portion 179 connected to other layers or external driving circuits.

First to third drain electrodes 175a, 175b, and 175c have wide end portions 177a, 177b, and 177c at one side thereof, respectively, and bar-shaped end portions at the other side thereof. The wide end portions 177a and 177b of the first and second drain electrodes 175a and 175b are overlapped with the first and second storage electrodes 137a and 137b, respectively, and the bar-shaped end portions thereof are partially surrounded by the first and second source electrodes 173a and 173b, respectively. The wide end portion 177b of the second drain electrode 175b extends to thereby form a bar-shaped third source electrode 173c. In other words, the second drain electrode 175b and the third source electrode 173c may be integrally formed. The wide end portion 177c of the third drain electrode 175c is overlapped with the second storage electrode 137b, and the bar-shaped end portion thereof faces the third source electrode 173c.

The first, second, and third gate electrodes 124a, 124b, and 124c, the first, second, and third source electrodes 173a, 173b, and 173c, and the first, second, and third drain electrodes 175a, 175b, and 175c form first, second, and third thin film transistors (TFT) Qa, Qb, and Qc together with the first, second, and third semiconductor islands 154a, 154b, and 154c, and the channels of the thin film transistors are formed in the semiconductors 154a, 154b, and 154c between the source electrodes 173a, 173b, and 173c and the drain electrodes 175a, 175b, and 175c, respectively.

A passivation layer 180 is formed on the data conductors 171, 175a, 175b, and 175c and the exposed portions of the semiconductors 154a, 154b and 154c.

The passivation layer 180 has a plurality of contact holes 182, 185a, and 185b exposing the end of portion 179 of the data line 171, the wide end portion 177a of the first drain electrode 175a, and the wide end portion 177b of the second drain electrode 175b, respectively. The passivation layer 180 and the gate insulating layer 140 commonly have a plurality of contact holes 181a and 181b exposing the end portions 129a and 129b of the gate lines 121a and 121b, respectively.

A pixel electrode 191, which includes first and second sub-pixel electrodes 191a and 191b, and a plurality of contact assistants 81a, 81b, and 82, are formed on the passivation layer 180.

The first sub-pixel electrode 191a has a pair of vertical edges facing each other, and two pairs of first to fourth oblique edges neighboring the pair of vertical edges. The second sub-pixel electrode 191b also has a pair of vertical edges facing each other, and two pairs of first to fourth oblique edges neighboring the vertical edges. The respective vertical edges are parallel to the data line 171, and the respective oblique edges are obliquely angled to the vertical edges at 45° or 135°. The first and second oblique edges meet each other at right angles, and the third and fourth oblique edges meet each other at right angles.

The first and second sub-pixel electrodes 191a and 191b are adjacent to each other in the column direction, and the first sub-pixel electrode 191a is smaller in height than the second sub-pixel electrode 191b.

The first sub-pixel electrode 191a has a cutout 91, and the second sub-pixel electrode 191b has cutouts 92, 93 and 94.

The cutouts 91, 92, 93, and 94 of the first and second sub-pixel electrodes 191a and 191b are angled to the gate lines 121a and 121b at about 45°. The pixel electrode 191 is partitioned into several domains by way of the cutouts 91, 92, 93, and 94. The number of domains or cutouts may be altered depending upon design factors such as the pixel size, the length ratio of the horizontal edge of the pixel electrode to the vertical edge thereof, and the kind or characteristics of the liquid crystal layer 3.

The first and second sub-pixel electrodes 191a and 191b are respectively connected to the first and second drain electrodes 175a and 175b through the contact holes 185a and 185b to receive data voltages therefrom. Furthermore, the second sub-pixel electrode 191b is connected to the third source electrode 173c through the contact hole 185b. As the second sub-pixel electrode 191b is connected to the second drain electrode 175b and the third source electrode 173c through the second contact hole 185b, only two contact holes 185a and 185b need be formed per pixel. Accordingly, the aperture ratio may be enhanced compared to the case where the second sub-pixel electrode 191b is connected to the second drain electrode 175b and the third source electrode 173c through two different contact holes, respectively.

The first and second sub-pixel electrodes 191a and 191b generate electric fields together with the common electrode 270 of the common electrode display panel 200, thereby determining the alignment directions of the liquid crystal molecules of the liquid crystal layer 3 between the two electrodes 191 and 270. The polarization of light passing through the liquid crystal layer 3 is differentiated depending upon the determined alignment directions of the liquid crystal molecules. The pixel electrode 191 and the common electrode 270 form a liquid crystal capacitor to store voltages applied thereto even after the thin film transistors turn off.

The first and second sub-pixel electrodes 191a and 191b are respectively overlapped with the storage electrode lines 131a and 131b including the first and second storage electrodes 137a and 137b. The pixel electrode 191 is overlapped with the storage electrode lines 131a and 131b so as to form storage capacitors, which reinforce the voltage storage capacity of the liquid crystal capacitors.

The second storage electrode 137b and the wide end portion 177c of the third drain electrode 175c are overlapped with each other with the gate insulating layer 140 disposed therebetween so as to form the step-down capacitor Cstd, and the wide end portion 177c of the third drain electrode 175c and the second sub-pixel electrode 191b are overlapped with each other with the passivation layer 180 disposed therebetween so as to form the step-up capacitor Cstu. As the passivation layer 180 is thicker than the gate insulating layer 140, the step-down capacitor Cstd is greater in capacitance than the step-up capacitor Cstu.

As described above, with a liquid crystal display according to an exemplary embodiment of the present invention, the step-down capacitor Cstd and the step-up capacitor Cstu are formed using the second storage electrode 137b without providing a separate storage electrode so that the aperture ratio can be enhanced compared to the case where a separate storage electrode is provided to form the step-down capacitor Cstd and the step-up capacitor Cstu.

The contact assistants 81a and 81b are connected to the end portions 129a and 129b of the gate lines 121a and 121b through the contact holes 181a and 181b, respectively. The contact assistant 82 is connected to the end portion 179 of the data line 171 through the contact hole 182. The contact assistants 81a, 81b, and 82 serve to assist the adhesion of the end portions 129a and 129b of the gate lines 121a and 121b and the end portion 179 of the data line 171 to external devices while protecting them.

An alignment layer 11 is formed on the pixel electrode 191, the contact assistants 81a, 81b, and 82, and the passivation layer 180.

The upper display panel 200 will now be described in detail.

A light blocking member 220 is formed on an insulation substrate 210. The light blocking member 220, which is also called a black matrix, prevents the leakage of light.

A plurality of color filters 230 are formed on the insulation substrate 210. The color filters 230 mostly exist within the area surrounded by the light blocking member 220, and they may longitudinally extend along the columns of the pixel electrodes 191 in the vertical direction. The respective color filters 230 may express one of three primary colors of red, green, and blue.

An overcoat 250 is formed on the color filters 230 and the light blocking member 220.

The common electrode 270 is formed on the overcoat 250. A plurality of cutouts 71, 72, 73, 73, 74, and 75 are formed in the common electrode 270. The respective cutouts 71 to 75 have at least one oblique portion proceeding parallel to the cutouts 91 to 94 of the pixel electrode 191. Triangle-shaped notches are formed at the oblique portions of the cutouts 71 to 75.

Alignment layers 11 and 21 are formed on the inner surfaces of the display panels 100 and 200, respectively.

The liquid crystal layer 3 has negative dielectric anisotropy, and liquid crystal molecules of the liquid crystal layer 3 are aligned such that the directors thereof stand vertical to the surface of the two display panels 100 and 200.

When the liquid crystal capacitors Clca and Clcb are charged, a generated electric field is substantially vertical to the surface of the display panels 100 and 200. In response to the electric field, the liquid crystal molecules are inclined to be oriented such that the directors thereof stand vertical to the direction of the electric field.

The cutouts 91 to 94 and 71 to 75 of the pixel electrode 191 and the common electrode 270, and the oblique edges of the pixel electrode 191 proceeding parallel thereto, deform the electric fields, and form horizontal components for determining the inclination direction of the liquid crystal molecules. The horizontal components of the electric field stand vertical to the oblique edges of the cutouts 91 to 94 and 71 to 75, and the oblique edges of the pixel electrode 191.

The common electrode cutouts 71 to 75 and the pixel electrode cutouts 91 to 94 partition the pixel electrode 191 into a plurality of domains, each of which has two major edges obliquely angled to the major edges of the pixel electrode 191. The liquid crystal molecules over the respective pixel electrode domains are mostly inclined in a direction vertical to the major edges thereof, and hence, roughly four inclination directions are made. As the inclination directions of the liquid crystal molecules are diversified, the reference viewing angle of the liquid crystal display widens.

A light interception member 135 is formed along the first and second oblique edges of the first sub-pixel electrode 191a, and the third and fourth oblique edges of the second sub-pixel electrode 191b. The light interception member 135 has a plurality of steps 136 with horizontal and vertical portions 136a and 136b. The horizontal portion 136a is parallel to the gate lines 121a and 121b, and the vertical portion 136b is parallel to the data line 171. The polarization axes of the polarizers 12 and 22 are angled to the oblique edges at 45° or 135°, and therefore leakage of light may not occur around the oblique edges. If the light interception member 135, which has steps 136 each with horizontal and vertical portions 136a and 136b standing parallel to the polarization axis of the polarizers 12 and 22, is disposed at the first and second oblique edges of the first sub-pixel electrode 191a and the third and fourth oblique edges of the second sub-pixel electrode 191b, the possible leakage of light at the area of the pixel electrode 191 can be prevented.

The horizontal and vertical portions 136a and 136b of the step 136 may have the same length. The horizontal and vertical portions 136a and 136b may have a length in the range of 8 μm to 12 μm.

The operation of a liquid crystal display according to an exemplary embodiment of the present invention will now be described with reference to FIG. 1, FIG. 2, FIG. 3, and FIG. 8.

Figure 8:
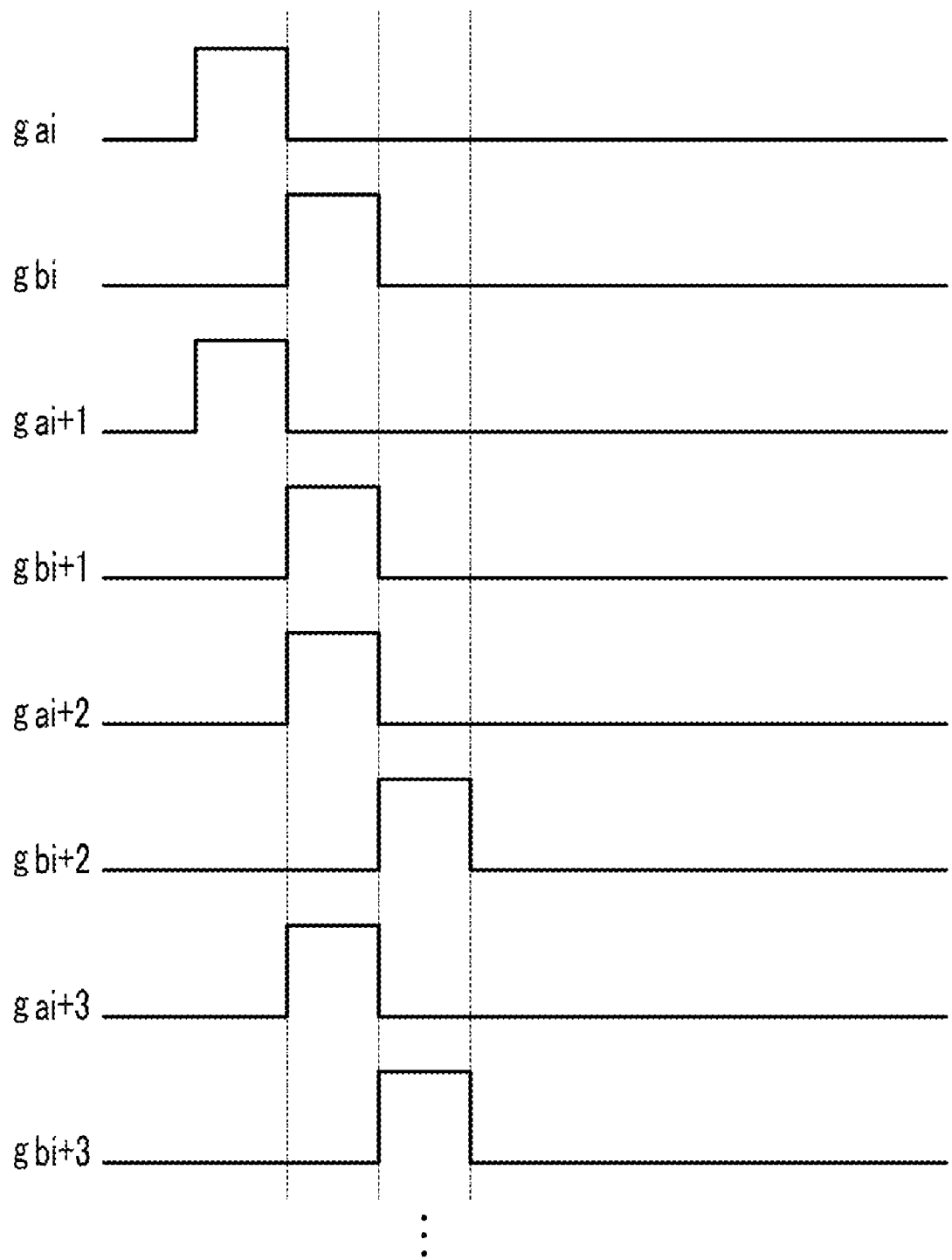
FIG. 8 is a waveform diagram of gate signals in a liquid crystal display according to an exemplary embodiment of the present invention.

FIG. 8 is a waveform diagram of gate signals in a liquid crystal display according to an exemplary embodiment of the present invention.

Referring to FIG. 1, the signal controller 600 receives input image signals R, G, and B and input control signals for controlling those input image signals from an external graphics controller (not shown). The input image signals R, G, and B contain information regarding luminance of the respective pixels PX, which has a predetermined number of grays, for example $1024=2^{10}$, $256=2^8$, or $64=2^6$ grays. The input control signals include vertical synchronization signals Vsync, horizontal synchronization signals Hsync, main clock signals MCLK, and data enable signals DE.

The signal controller 600, based on the received input image signals R, G, and B and input control signals, properly processes the input image signals R, G, and B in accordance with the operating conditions of the liquid crystal panel assembly 300, and generates gate control signals CONT1 and data control signals CONT2. The signal controller 600 then transmits the gate control signals CONT1 to the gate driver 400, while transmitting the data control signals CONT2 and the processed image signals DAT to the data driver 500. The output image signals DAT have a predetermined number of values or grays as digital signals.

Depending upon the data control signals CONT2 from the signal controller 600, the data driver 500 receives the digital image signals DAT for one row of pixels PX, selects gray voltages corresponding to the respective digital image signals DAT, converts the digital image signals DAT into analog data voltages, and applies them to the relevant data lines DL.

Upon receipt of the gate control signals CONT1 from the signal controller 600, the gate driver 400 applies gate-on voltages Von to the gate lines GLa and GLb so as to turn on the switching elements Qa, Qb, and Qc connected to the gate lines GLa and GLb. Then, the data voltages Vd applied to the data lines DL are applied to the relevant pixels PX through the turned-on first and second switching elements Qa and Qb.

Description will be now given with respect to a particular row of pixels, for example, the i-th pixel row.

Referring to FIG. 8, a first gate signal $g_{ai}$ is applied to the first gate line GLa of the i-th pixel row, and a second gate signal $g_{bi}$ is applied to the second gate line GLb thereof When the first gate signal $g_{ai}$ shifts from the gate-off voltage Voff to the gate-on voltage Von, the first and second switching elements Qa and Qb connected thereto turn on. Accordingly, the data voltage Vd applied to the data line DL is applied to the first and second sub-pixel electrodes 191a and 191b through the turned-on first and second switching elements Qa and Qb. In this case, the data voltages Vd applied to the first and second sub-pixel electrodes 191a and 191b are identical to each other. The first and second liquid crystal capacitors Clca and Clcb are charged with the same value as a difference between the common voltage and the data voltage Vd.

Thereafter, when the first gate signal $g_{ai}$ shifts from the gate-on voltage Von to the gate-off voltage Voff, and simultaneously the second gate signal $g_{bi}$ shifts from the gate-off voltage Voff to the gate-on voltage Von, the first and second switching elements Qa and Qb turn off, and the third switching element Qc turns on. Then, the charges travel from the second sub-pixel electrode 191b to the third drain electrode 175c through the third switching element Qc. Consequently, the voltage charged at the second liquid crystal capacitor Clcb is lowered, while the step-down capacitor Cstd and the step-up capacitor Cstu are charged. Thereafter, when the second gate signal $g_{bi}$ shifts from the gate-on voltage Von to the gate-off voltage Voff, the third switching element Qc turns off, and the step-up capacitor Cstu floats. In this case, the voltage charged at the second liquid crystal capacitor Clcb increases by as much as the voltage charged at the step-up capacitor Cstu. However, as the step-down capacitor Cstd is greater in capacitance than the step-up capacitor Cstu, the voltage charged at the second liquid crystal capacitor Clcb becomes lower than that charged at the first liquid crystal capacitor Clca.

The voltages charged at the two liquid crystal capacitors Clca and Clcb express different gamma curves, which are combined to be a complex gamma curve of a pixel voltage. The frontal complex gamma curve coincides with the reference gamma curve at the optimally-determined front side, and the lateral gamma curve approximates the frontal reference gamma curve. In this way, the image data are converted so that the lateral visibility is improved.

Meanwhile, the first gate signal $g_{ai}$ applied to the first gate line of the i-th row shifts from the gate-on voltage Von to the gate-off voltage Voff, and simultaneously the second gate signal $g_{bi}$ applied to the second gate line of the i-th row shifts from the gate-off voltage Voff to the gate-on voltage Von.

The gate signal $g_{ai+1}$ applied to the second gate line of the (i+1)th row is the same as the first gate signal $g_{ai}$ applied to the first gate line of the i-th row, and the gate signal $g_{bi+1}$ applied to the second gate line of the (i+1)th row is the same as the second gate signal $g_{bi}$ applied to the second gate line of the i-th row. This pattern is repeated for the subsequent gate signals $g_{ai+2}$, $g_{bi+2}$, $g_{ai+3}$, and $g_{bi+3}$.

The above process is repeated by a unit one one horizontal period, which is also called "1H," and is the same as one cycle of the horizontal synchronization signal Hsync and the data enable signal DE, thereby applying data voltages Vd to all the pixels PX and displaying images of one frame.

After one frame ends, the next frame begins, and the reverse signal RVS applied to the data driver 500 is controlled such that the data voltage Vd applied to each pixel PX is opposite in polarity to that in the previous frame.

A liquid crystal display according to another exemplary embodiment of the present invention will now be described in detail with reference to FIG. 9.

Figure 9:
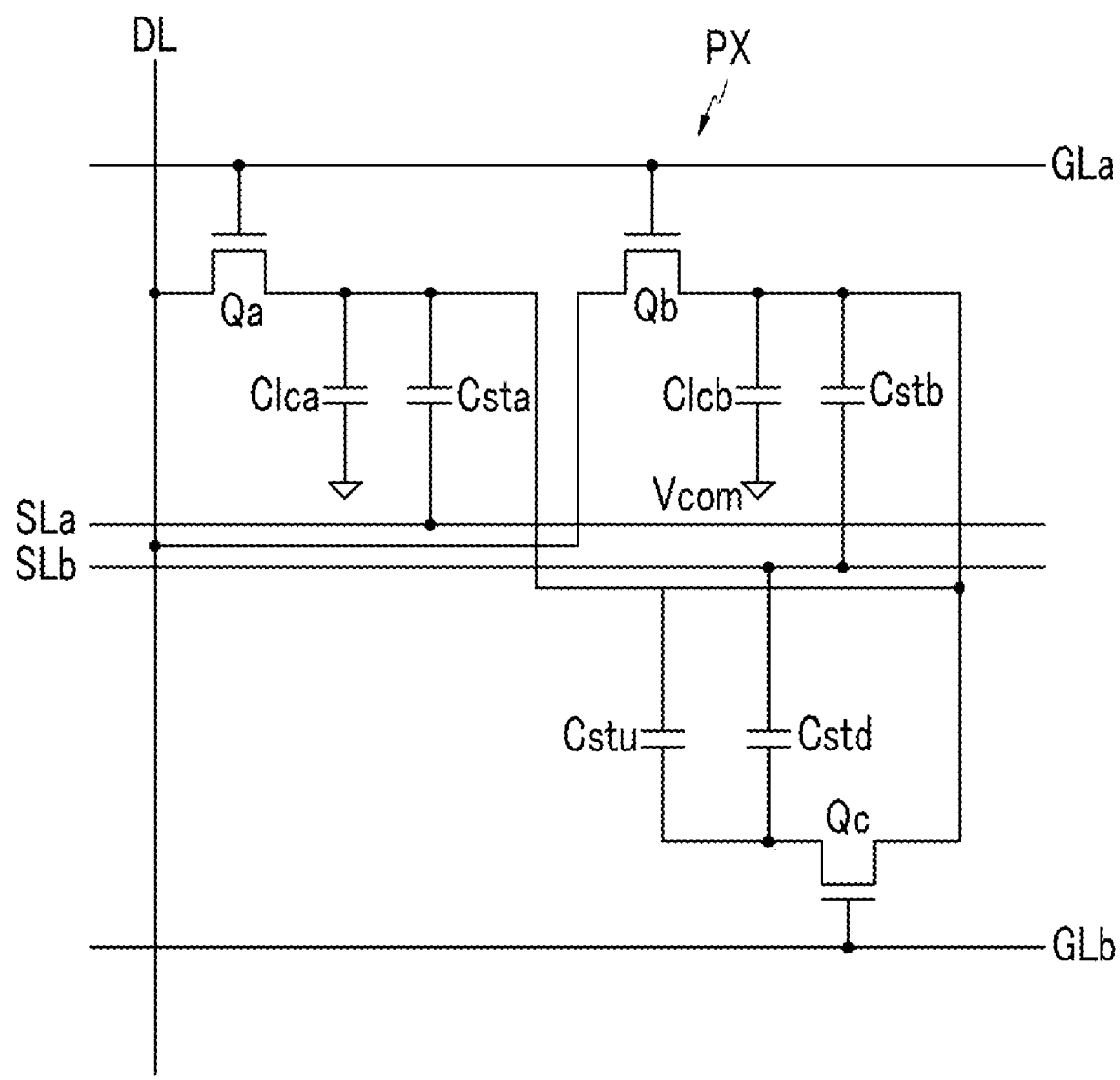
FIG. 9 is a circuit diagram of a pixel of a liquid crystal display according to another exemplary embodiment of the present invention.

FIG. 9 is a circuit diagram of a pixel in a liquid crystal display according to another exemplary embodiment of the present invention.

Referring to FIG. 9, the liquid crystal display includes signal lines including first and second gate lines GLa and GLb neighboring each other, a data line DL, storage electrode lines Sla and SLb, and a pixel PX connected thereto, like that shown in FIG. 3.

The pixel PX has first, second, and third switching elements Qa, Qb, and Qc, first and second liquid crystal capacitors Clca and Clcb, first and second storage capacitors Csta and Cstb, a step-down capacitor Cstd, and a step-up capacitor Cstu.

However, the liquid crystal display shown in FIG. 9 differs from the liquid crystal display shown in FIG. 3 in that the step-up capacitor Cstu is connected to the first liquid crystal capacitor Clca as well as to the second liquid crystal capacitor Clcb.

Accordingly, after the third switching element Qc turns on and then turns off, the second liquid crystal capacitor Clcb is elevated to the voltage charged at the step-up capacitor Cstu, and the voltage charged at the first liquid crystal capacitor Clca is also elevated. Then, compared to the state before the third switching element Qc turns on, the voltage charged at the first liquid crystal capacitor Clca is elevated, and the voltage charged at the second liquid crystal capacitor Clcb is lowered. Consequently, the difference between the first and second liquid crystal capacitors Clca and Clcb becomes larger so that the lateral visibility is further improved.

Photomasks for forming a light interception member of a liquid crystal display according to several exemplary embodiments of the present invention will now be described in detail with reference to FIG. 10 to FIG. 16L.

A photomask for forming a light interception member of a liquid crystal display according to an exemplary embodiment of the present invention will be described with reference to FIG. 10, FIG. 11A, FIG. 11B, and FIG. 11C.

Figure 10:
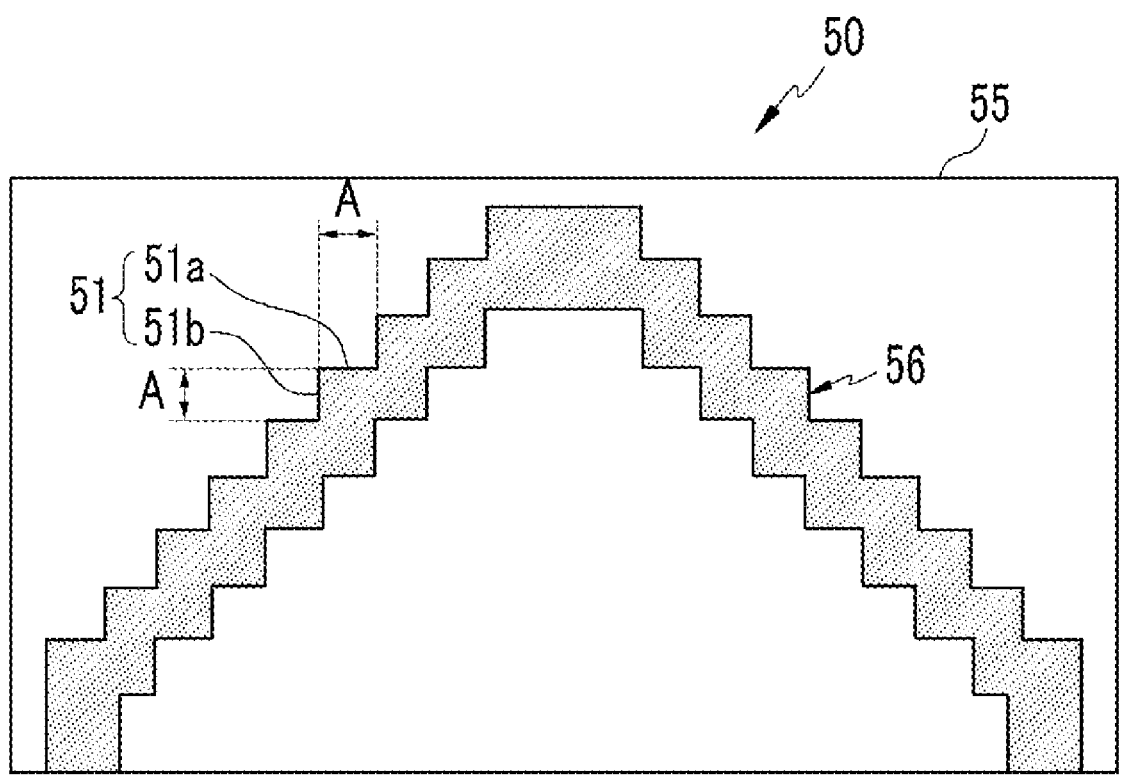
FIG. 10 is a plan view of a photomask for forming a light interception member of a liquid crystal display according to an exemplary embodiment of the present invention.
Figure 11A:
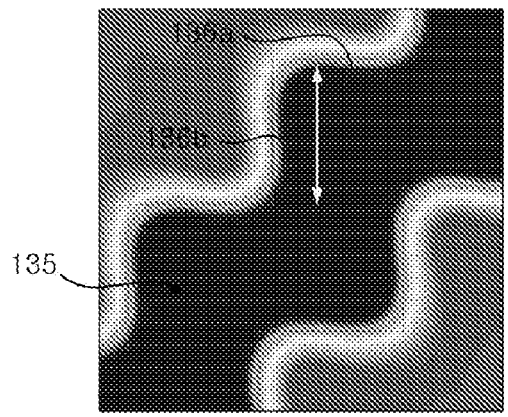
FIG. 11A, FIG. 11B, and FIG. 11C are photographs of a light interception member of a liquid crystal display formed using the photomask shown in FIG. 10.
Figure 11B:
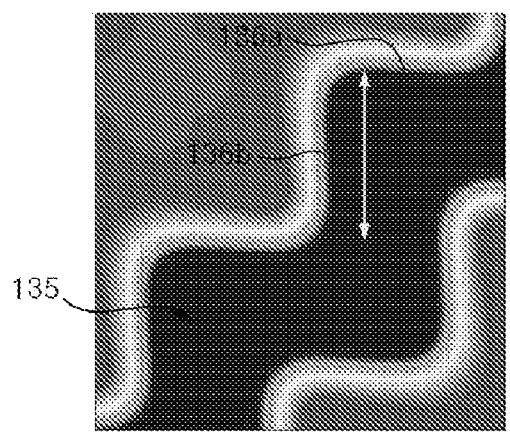
Figure 11C:
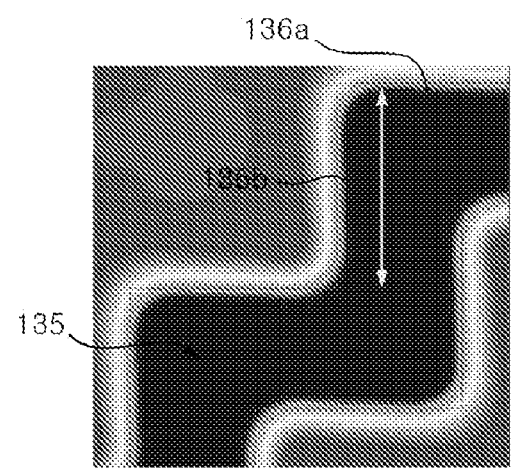

FIG. 10 is a plan view of a photomask for forming a light interception member of a liquid crystal display according to an exemplary embodiment of the present invention, and FIG. 11A, FIG. 11B, and FIG. 11C are photographs of a light interception member of a liquid crystal display formed using the photomask shown in FIG. 10.

Referring to FIG. 10, the photomask 50 includes a substrate 55, and a photo-barrier film 56 formed on the substrate 55.

The photo-barrier film 56 may be formed with an opaque pigment to that it does not pass light therethrough during a photolithography exposure step. Accordingly, a thin film of the liquid crystal display may be formed depending upon the pattern of the photo-barrier film 56. The photo-barrier film 56 shown in FIG. 10 is used to form a light interception member 135 of the liquid crystal display.

A photo-barrier film 56 of a photomask 50 according to an exemplary embodiment of the present invention includes a plurality of steps 51. The respective steps 51 have a first edge 51a that is parallel to the gate lines 121a and 121b, and a second edge 51b that is parallel to the data line 171. The first and second edges 51a and 51b may have the same length A. The first and second edges 51a and 51b may have a length A in the range of 8 µm to 12 µm.

FIG. 11A shows a light interception member 135 formed using a photomask where the first and second edges 51a and 51b of the photomask 50 have a length A of 8 µm, FIG. 11B shows a light interception member 135 formed using a photomask where the first and second edges 51a and 51b of the photomask 50 have a length A of 10 µm, and FIG. 11C shows a light interception member 135 formed using a photomask where the first and second edges 51a and 51b of the photomask 50 have a length A of 12 µm.

Referring to FIG. 11A, FIG. 11B, and FIG. 11C, as the length A of the first and second edges 51a and 51b of the photomask 50 decreases, the corner of the light interception member 135 where horizontal and vertical portions 136a and 136b thereof meet each other becomes more rounded. Accordingly, when the first and second edges 51a and 51b of the photomask 50 have a length A of less than 8 µm, it is difficult to make the corners of the horizontal and the vertical portions 136a and 136b of the light interception member 135 sharp. By contrast, when the first and second edges 51a and 51b of the photomask 50 have a length A exceeding 12 µm, the length of the horizontal and the vertical portions 136a and 136b of the light interception member 135 is elongated accordingly, and it becomes difficult to form the light interception member 135 along the outline of the first and second oblique edges of the first sub-pixel electrode 191a, and the third and fourth oblique edges of the second sub-pixel electrode 191b.

Now, a photomask for forming a light interception member of a liquid crystal display according to another exemplary embodiment of the present invention will be described in detail with reference to FIG. 12 and FIG. 13.

Figure 12:
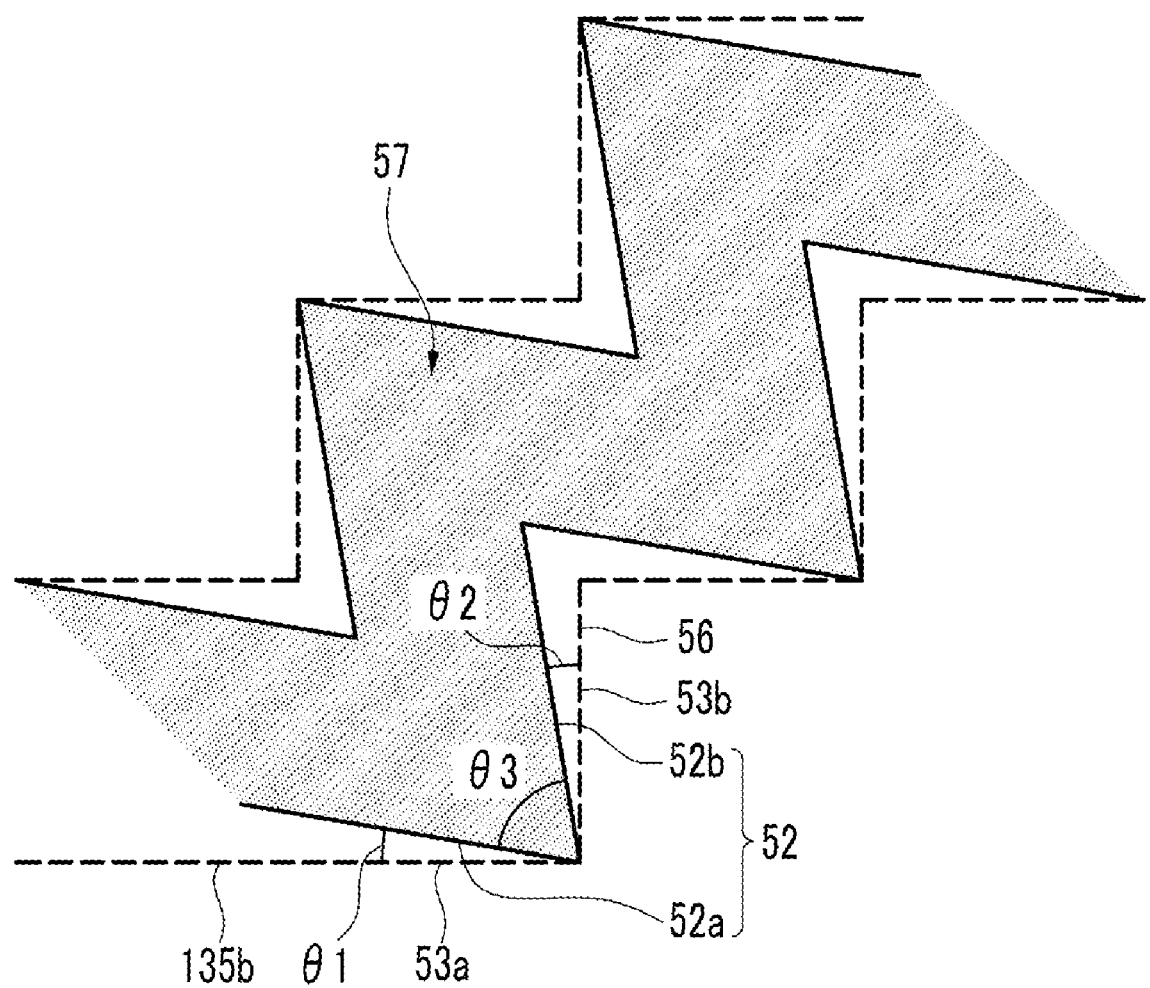
FIG. 12 is a plan view of a photomask for a light interception member of a liquid crystal display according to another exemplary embodiment of the present invention.
Figure 13:
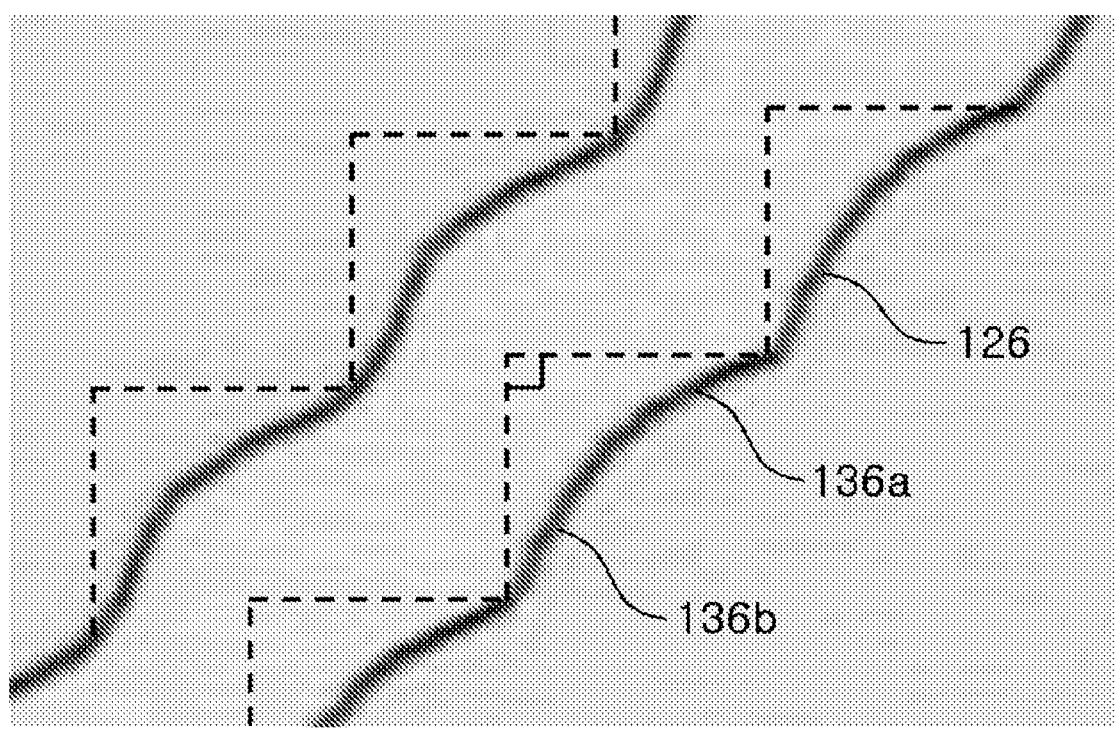
FIG. 13 shows a light interception member of a liquid crystal display formed using a conventional photomask.

FIG. 12 is a plan view of a photomask for forming a light interception member of a liquid crystal display according to another exemplary embodiment of the present invention, and FIG. 13 illustrates a light interception member of a liquid crystal display using a conventional photomask.

Referring to FIG. 12, a photo-barrier film 57 of the photomask according to the present embodiment has a plurality of steps 52 with first and second edges 52a and 52b. The photo-barrier film 57 shown in FIG. 12 differs from that shown in FIG. 10 in that the first edge 52a meets an imaginary line 53a that is parallel to the gate lines 121a and 121b at a first oblique angle of θ1, and the second edge 52b meets an imaginary line 53b that is parallel to the data line 171 at a second oblique angle of θ2. The first and second oblique angles θ1 and θ2 may be identical with each other. The first and second edges 52a and 52b meet each other at a third oblique angle of θ3, which is in the range of 60° to 90°.

Referring to FIG. 13, with a light interception member 135 formed using a conventional mask, the step-like portions are not properly formed, and have a substantially rounded shape. That is, the horizontal and vertical portions 136a and 136b of the light interception member 135 are not properly formed. Consequently, the light interception member 135 does not intercept light in a suitable manner. On the other hand, with the photomask shown in FIG. 12, when the angle θ3 of the first edge 52a of the photo-barrier film 57 to the second edge 52b thereof is established to be in the range of 60° to 90°, it becomes possible to make the horizontal portion 136a of the light interception member 135 substantially parallel to the gate lines 121a and 121b, and the vertical portion 136b thereof substantially parallel to the data line 171.

A photomask for forming a light interception member of a liquid crystal display according to another exemplary embodiment of the present invention will now be described in detail with reference to FIG. 14, FIG. 15, FIG. 16A, FIG. 16B, FIG. 16C, FIG. 16D, FIG. 16E, FIG. 16F, FIG. 16G, FIG. 16H, FIG. 16I, FIG. 16J, FIG. 16K, and FIG. 16L.

Figure 14:
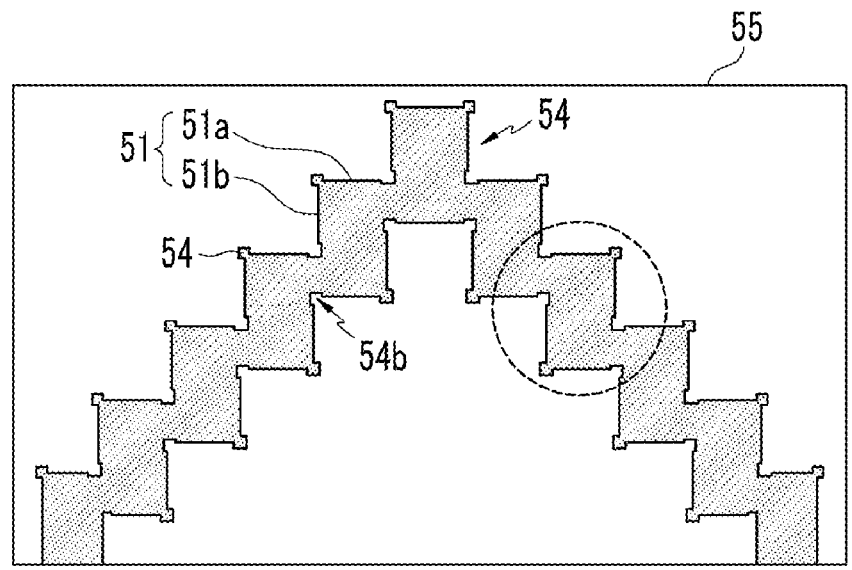
FIG. 14 is a plan view of a photomask according to another exemplary embodiment of the present invention.
Figure 15:
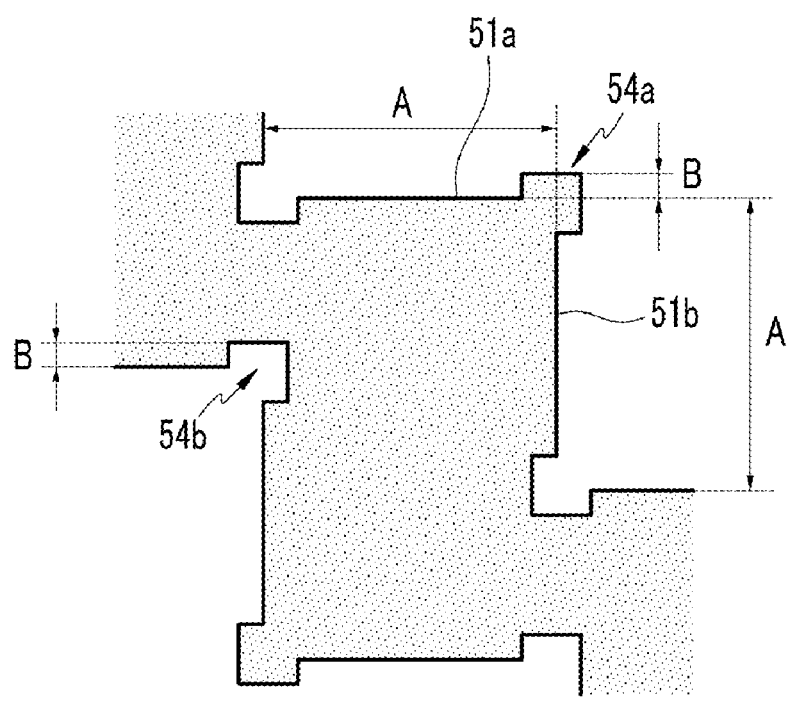
FIG. 15 is an amplified view of the dotted-line circular portion of FIG. 14.

FIG. 14 is a plan view of a photomask according to another exemplary embodiment of the present invention, FIG. 15 is an amplified view of the dotted-lined circular portion of FIG. 14, and FIG. 16A to FIG. 16L are photographs of a light interception member of a liquid crystal display formed using versions of the photomask shown in FIG. 14.

Referring to FIG. 14, a photo-barrier film 54 of the photomask according to the present exemplary embodiment also has a plurality of steps 51 each with first and second edges 51a and 51b. However, the photo-barrier film 54 shown in FIG. 14 differs from the photo-barrier film 56 shown in FIG. 10 in that it has convex and concave portions 54a and 54b at the corner where the first and second edges 51a and 51b thereof meet.

Referring to FIG. 15, the convex portion 54a is protruded from the first and second edges 51a and 51b by a predetermined length B (referred to hereinafter as the height of the convex portion 54a), and the concave portion 54b is recessed from the first and second edges 51a and 51b by a predetermined length B (referred to hereinafter as the height of the concave portion 54b). The convex and concave portions 54a and 54b may have the same height B. The height B of the convex and concave portions 54a and 54b may be in the range of more than 0 µm to 2 µm.

Figure 16A:
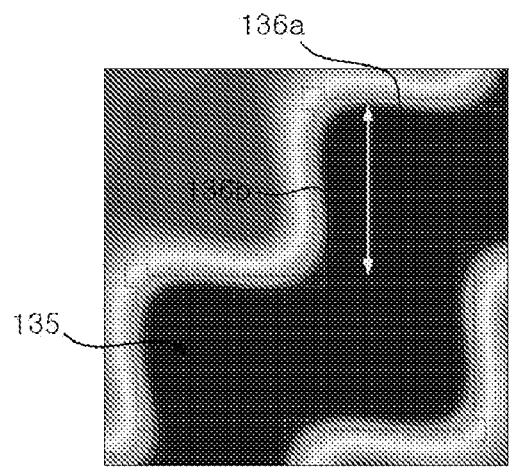
FIG. 16A, FIG. 16B, FIG. 16C, FIG. 16D, FIG. 16E, FIG. 16F, FIG. 16G, FIG. 16H, FIG. 16I, FIG. 16J, FIG. 16K, and FIG. 16L are photographs of a light interception member of a liquid crystal display formed using versions of the photomask shown in FIG. 14.
Figure 16B:
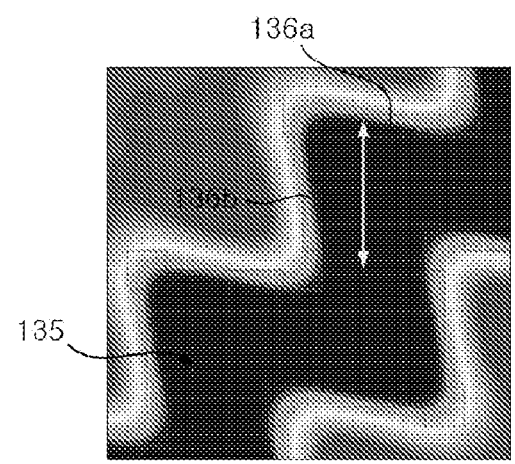
Figure 16C:
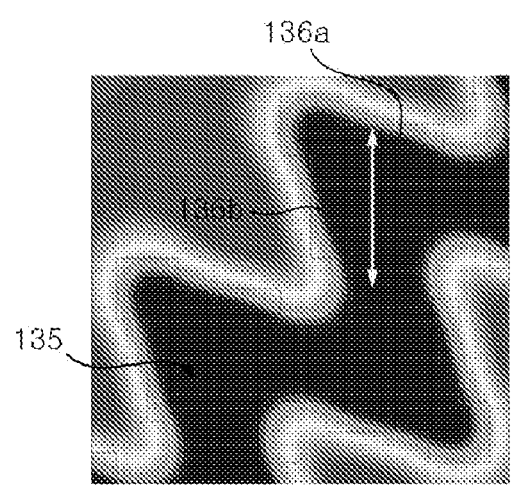
Figure 16D:
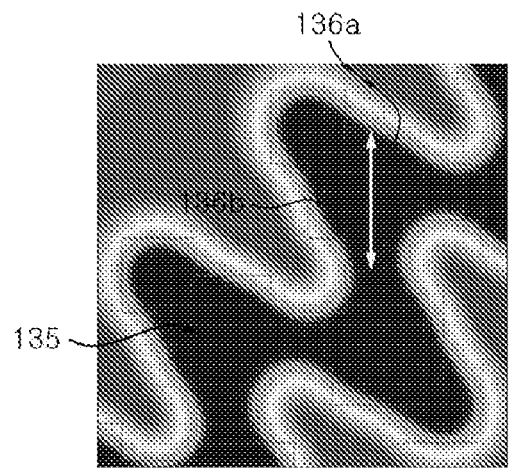
Figure 16E:
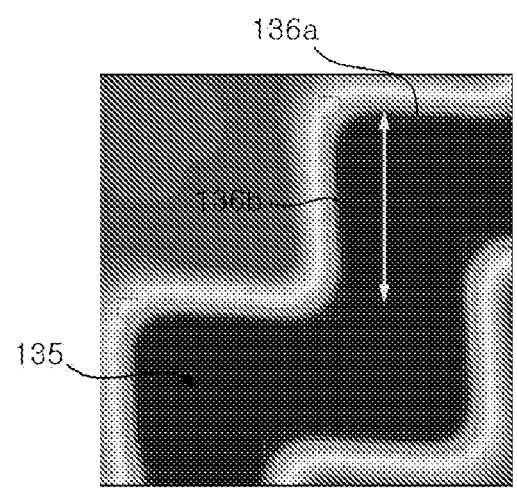
Figure 16F:
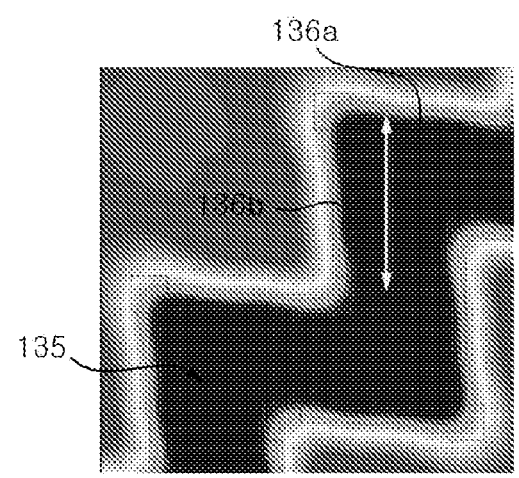
Figure 16G:
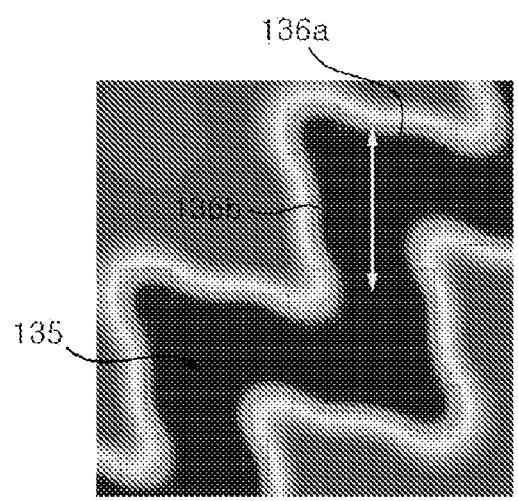
Figure 16H:
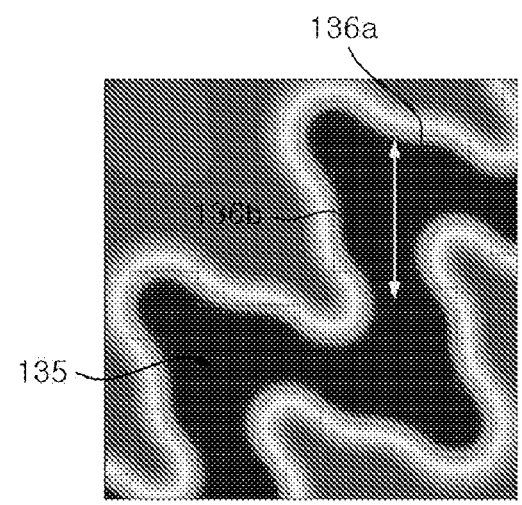
Figure 16I:
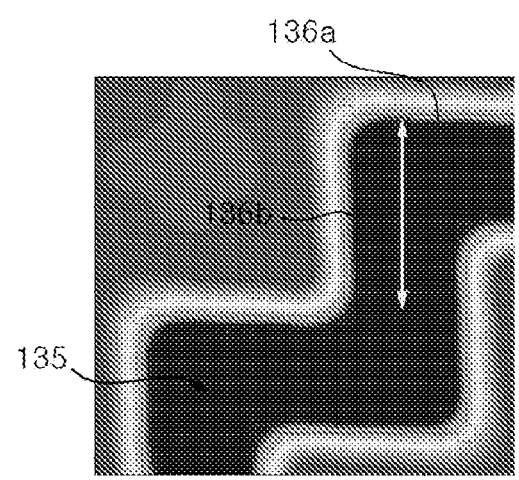
Figure 16J:
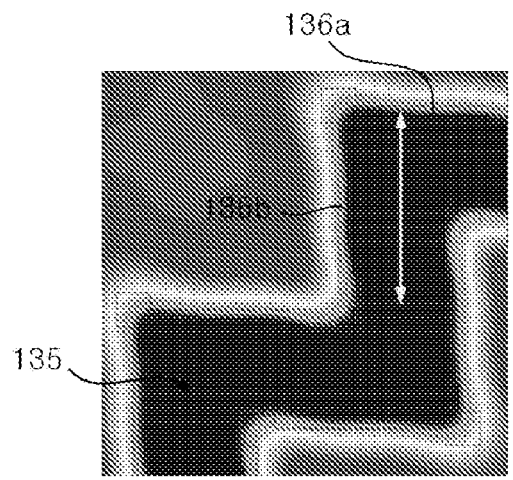
Figure 16K:
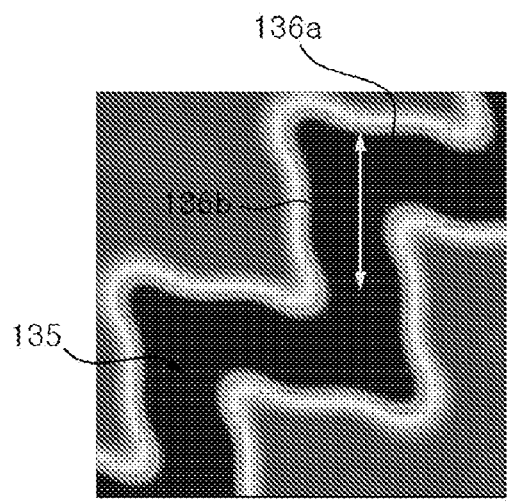
Figure 16L:
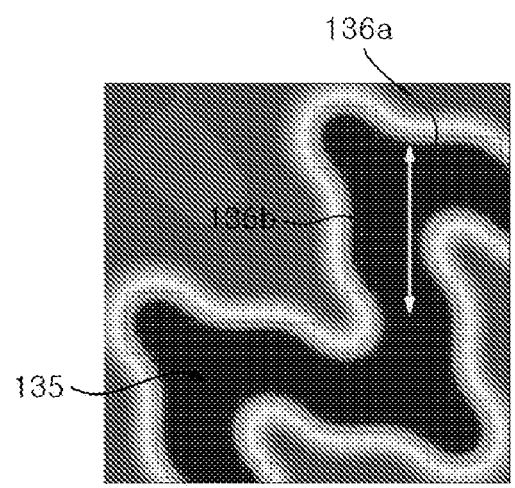

FIG. 16A to FIG. 16L each illustrate a light interception member 135 formed using a photomask with a photo-barrier film 54. FIG. 16A illustrates the case where the first and second edges 51a and 51b of the photo-barrier film 54 have a length A of 8 µm and the convex and concave portions 54a and 54b thereof have a height B of 0.5 µm. FIG. 16B illustrates the case where the first and second edges 51a and 51b of the photo-barrier film 54 have a length A of 8 µm and the convex and concave portions 54a and 54b thereof have a height B of 1 µm. FIG. 16C illustrates the case where the first and second edges 51a and 51b of the photo-barrier film 54 have a length A of 8 µm and the convex and concave portions 54a and 54b thereof have a height B of 1.5 µm. FIG. 16D illustrates the case where the first and second edges 51a and 51b of the photo-barrier film 54 have a length A of 8 µm and the convex and concave portions 54a and 54b thereof have a height B of 2 µm. FIG. 16E illustrates the case where the first and second edges 51a and 51b of the photo-barrier film 54 have a length A of 10 μm and the convex and concave portions 54a and 54b thereof have a height B of 0.5 μm. FIG. 16F illustrates the case where the first and second edges 51a and 51b of the photo-barrier film 54 have a length A of 10 μm and the convex and concave portions 54a and 54b thereof have a height B of 1 μm. FIG. 16G illustrates the case where the first and second edges 51a and 51b of the photo-barrier film 54 have a length A of 10 μm and the convex and concave portions 54a and 54b thereof have a height B of 1.5 μm. FIG. 16H illustrates the case where the first and second edges 51a and 51b of the photo-barrier film 54 have a length A of 10 μm and the convex and concave portions 54a and 54b thereof have a height B of 2 μm. FIG. 16I illustrates the case where the first and second edges 51a and 51b of the photo-barrier film 54 have a length A of 12 μm and the convex and concave portions 54a and 54b thereof have a height B of 0.5 μm. FIG. 16J illustrates the case where the first and second edges 51a and 51b of the photo-barrier film 54 have a length A of 12 μm and the convex and concave portions 54a and 54b thereof have a height B of 1 μm. FIG. 16K illustrates the case where the first and second edges 51a and 51b of the photo-barrier film 54 have a length A of 12 μm and the convex and concave portions 54a and 54b thereof have a height B of 1.5 μm. FIG. 16L illustrates the case where the first and second edges 51a and 51b of the photo-barrier film 54 have a length A of 12 μm and the convex and concave portions 54a and 54b thereof have a height B of 2 μm.

Referring to FIG. 16A to FIG. 16L, as the height B of the convex and concave portions 54a and 54b increases, the corner of the light interception member 135 where the horizontal and vertical portions 136a and 136b thereof meet each other becomes sharper. However, when the height B of the convex and concave portions 54a and 54b exceeds 2 μm, the first and second edges 136a and 136b of the light interception member 135 do not stand parallel to the gate lines 121a and 121b and data line 171 so that it becomes difficult for the light interception member to intercept light.

As described above, the pattern of the photomask is altered to thereby form a light interception member that is proper for the functions thereof.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display, comprising:
 a first substrate;
 a pixel electrode disposed on the substrate, the pixel electrode comprising a first sub-pixel electrode and a second sub-pixel electrode;
 a first thin film transistor comprising a first gate electrode, a first source electrode, and a first drain electrode, the first drain electrode being connected to the first sub-pixel electrode;
 a second thin film transistor comprising a second gate electrode, a second source electrode, and a second drain electrode, the second drain electrode being connected to the second sub-pixel electrode;
 a third thin film transistor comprising a third gate electrode, a third source electrode, and a third drain electrode, the third source electrode being connected to the second sub-pixel electrode,
 wherein a first gate signal is applied to the first gate electrode and the second gate electrode, a second gate signal is applied to the third gate electrode, a first data signal is applied to the first source electrode and the second source electrode, the second drain electrode and the third source electrode are connected to each other, and the third drain electrode is capacitively coupled with the second sub-pixel electrode;
 a second substrate opposed to the first substrate; and
 a liquid crystal layer interposed between the first substrate and the second substrate.

2. The liquid crystal display of claim 1, further comprising an insulating layer disposed between the first, second, and third source and drain electrodes, and the pixel electrode, wherein the insulating layer has a first contact hole through which the first drain electrode is connected to the first sub-pixel electrode, and a second contact hole through which the second drain electrode and the third source electrode are connected to the second sub-pixel electrode.

3. The liquid crystal display of claim 2, further comprising a first storage electrode line overlapped with the first sub-pixel electrode and the first drain electrode, and a second storage electrode line overlapped with the second sub-pixel electrode, the second drain electrode, the third source, and the third drain electrode.

4. The liquid crystal display of claim 3, wherein the first contact hole is formed at an overlapped area of the first storage electrode line and the first drain electrode, and the second contact hole is formed at an overlapped area of the second storage electrode line, the second drain electrode, and the third source electrode.

5. The liquid crystal display of claim 3, wherein the first sub-pixel electrode comprises a pair of vertical edges and first and second oblique edges neighboring the vertical edges, and the first and second oblique edges meet each other at a right angle.

6. The liquid crystal display of claim 5, further comprising a light interception member neighboring the first and second oblique edges and comprising a plurality of steps, each step comprising a horizontal portion and a vertical portion.

7. The liquid crystal display of claim 6, wherein the horizontal portion and the vertical portion of the step have a length in the range of 8 μm to 12 μm, respectively.

8. The liquid crystal display of claim 6, wherein the light interception member is formed on the same plane as the first and second storage electrode lines.

9. The liquid crystal display of claim 8, wherein the light interception member is connected to the first storage electrode line.

10. A liquid crystal display, comprising:
 a first gate line to transmit a first gate signal;
 a second gate line to transmit a second gate signal;
 a data line to transmit a data voltage;
 a first sub-pixel connected to the first gate line and the data line; and
 a second sub-pixel connected to the first gate line, the second gate line, and the data line,
 wherein the first sub-pixel comprises a first switching element connected to the first gate line and the data line, and a first liquid crystal capacitor and a first storage capacitor connected to the first switching element,
 wherein the second sub-pixel comprises a second switching element connected to the first gate line and the data line, a second liquid crystal capacitor and a second storage capacitor connected to the second switching element, a third switching element connected to the second gate line and the second liquid crystal capacitor, a step-down capacitor connected to the third switching element, and a step-up capacitor connected to the third switching element and the second liquid crystal capacitor, and wherein an input terminal of the third switching element is connected to the second liquid crystal capacitor.

11. The liquid crystal display of claim 10, wherein the step-up capacitor is also connected to the first liquid crystal capacitor.

12. A liquid crystal display, comprising:

a pixel electrode comprising a pair of vertical edges facing each other, and first and second oblique edges neighboring the vertical edges and meeting each other at a right angle; and a light interception member neighboring the first and second oblique edges, wherein the light interception member comprises a plurality of steps, each step comprising a horizontal portion and a vertical portion, and the horizontal portion and the vertical portion of the step each have a length in the range of 8 to 12 μm.

13. The liquid crystal display of claim 1, wherein the second drain electrode and the third source electrode are integrally formed with each other.

14. The liquid crystal display of claim 1, wherein the second drain electrode and the third source electrode are directly connected to each other.

* * * * *